(12) United States Patent
Lee et al.

(10) Patent No.: US 6,987,298 B2
(45) Date of Patent: Jan. 17, 2006

(54) CIRCUIT LAYOUT AND STRUCTURE FOR A NON-VOLATILE MEMORY

(75) Inventors: Chien-Hsing Lee, Jhubei (TW); Chin-Hsi Lin, Hsinchu (TW); Jhyy-Cheng Liou, Jhubei (TW)

(73) Assignee: Solide State System Co., Ltd., Hsinchu (TW)

( * ) Notice: Subject to any disclaimer, the term of this patent is extended or adjusted under 35 U.S.C. 154(b) by 9 days.

(21) Appl. No.: 10/823,488

(22) Filed: Apr. 12, 2004

(65) Prior Publication Data

US 2005/0224865 A1 Oct. 13, 2005

Related U.S. Application Data

(60) Provisional application No. 60/541,610, filed on Feb. 3, 2004.

(51) Int. Cl.
*H01L 29/792* (2006.01)

(52) U.S. Cl. .................. 257/324; 257/314; 257/315; 257/316; 257/320; 257/321; 257/322; 257/326

(58) Field of Classification Search ............... None
See application file for complete search history.

(56) References Cited

U.S. PATENT DOCUMENTS 6,674,132 B2 * 1/2004 Willer ................ 257/390
6,898,120 B2 * 5/2005 Natori ............... 365/185.14

* cited by examiner

*Primary Examiner*—Andy Huynh
(74) *Attorney, Agent, or Firm*—J.C. Patents

(57) ABSTRACT

A structure of non-volatile memory contains a substrate. A plurality of bit lines are formed in the substrate along a first direction, wherein each of the bit lines also serve as a source/drain (S/D) region. A first dielectric layer is disposed over the substrate. A plurality of selection gate (SG) lines are formed over the first dielectric layer between the bit lines. A plurality of charge-storage structure layer are formed over the substrate between the bit lines and the SG lines. A second dielectric layer is formed over the SG lines and a third dielectric layer is formed over the bit lines. A plurality of word lines are formed over the substrate along a second direction, which is crossing the first direction for the bit lines. Wherein, when a selected one of the SG lines is applied a voltage, another S/D region is created in the substrate under the selected one of the SG lines.

11 Claims, 21 Drawing Sheets

Program
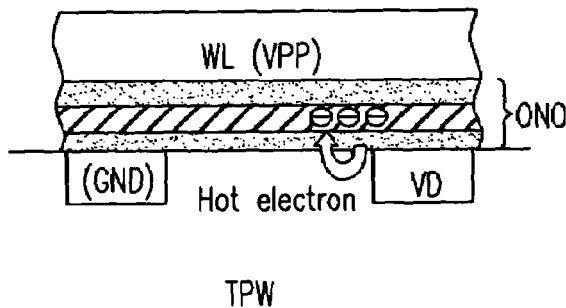
TPW
Program operation
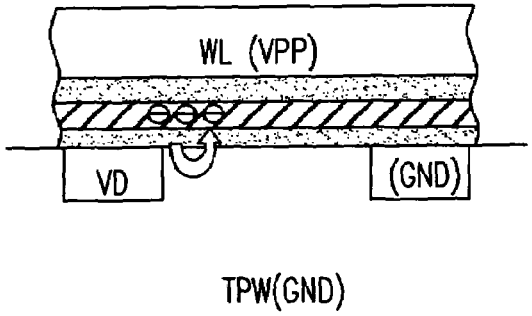
TPW(GND)
Read operation
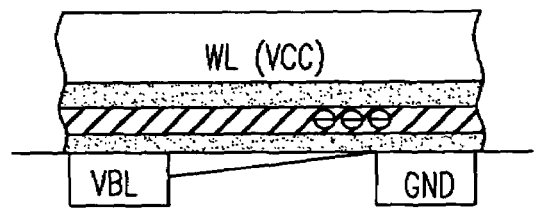
TPW
Reverse Read operation
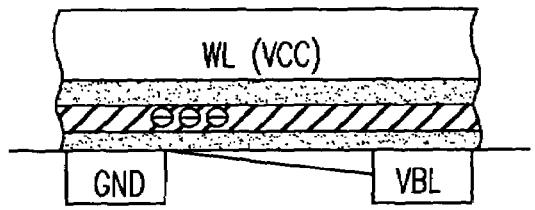
TPW(GND)
Erase operation
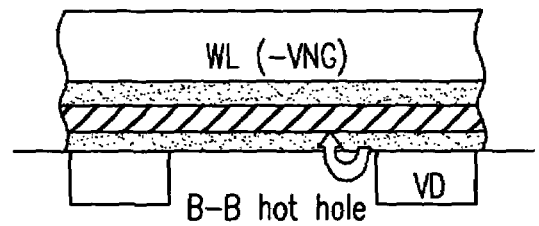
TPW(GND)
Erase operation
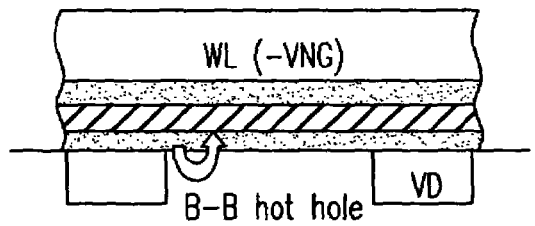
TPW(GND)
FIG. 3 (PRIOR ART)

Read operation:

Erase operation-2:(F-N erase)

Read operation-1:(VS is FG)

Read operation-2:(VS is biased to GND)

Program operation:

Program operation:

Program operation:

Read operation:

Read operation:

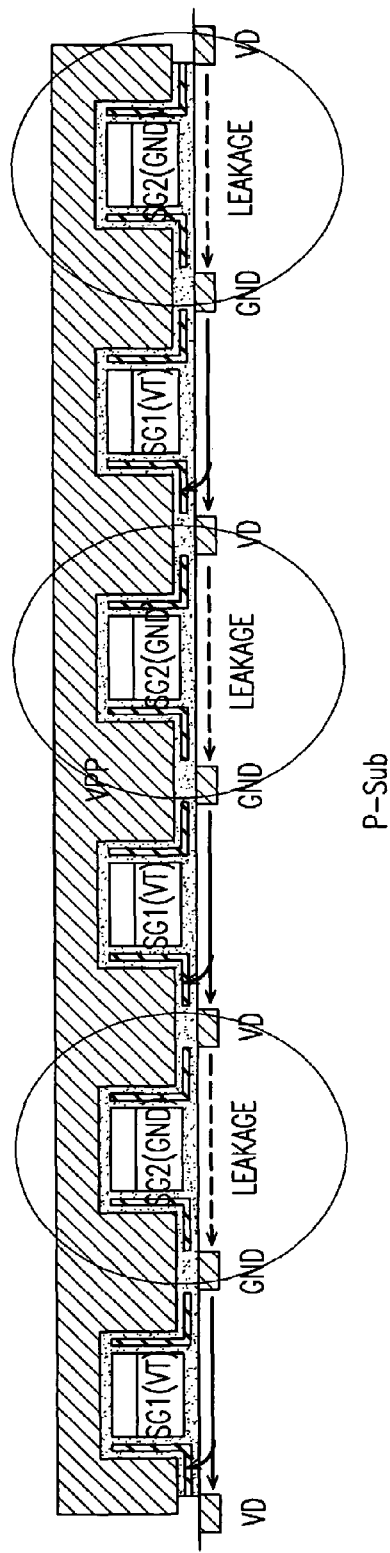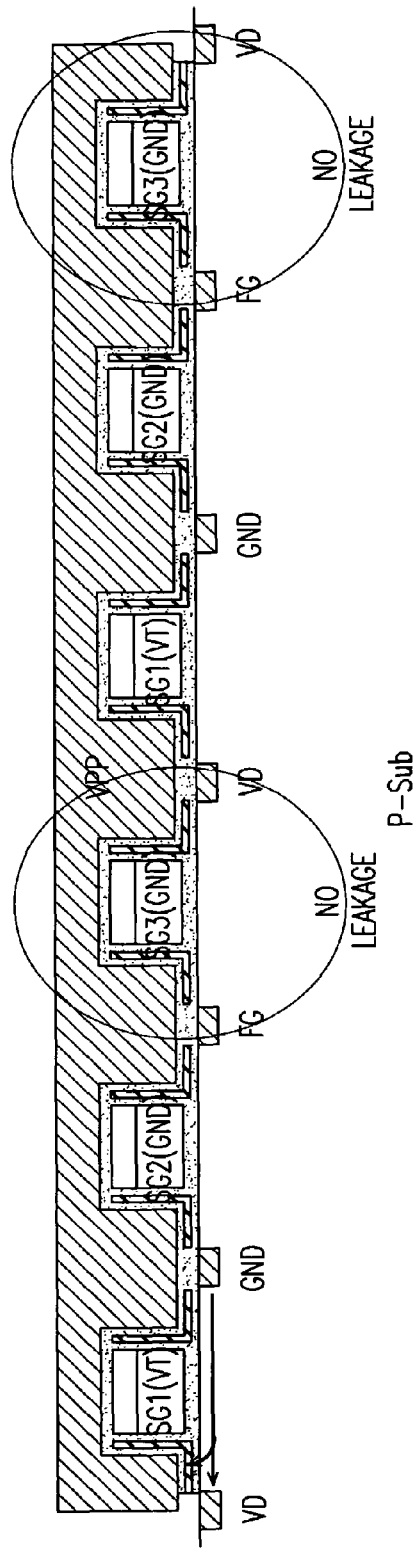
FIG. 9A
FIG. 9B

CIRCUIT LAYOUT AND STRUCTURE FOR A NON-VOLATILE MEMORY

CROSS-REFERENCE TO RELATED APPLICATION

This application claims the priority benefits of U.S. provisional application Ser. No. 60/541,610 titled "VIRTUAL GROUND FLASH MEMORY WITH SPLIT GATE STRUCTURE" filed on Feb. 3, 2004. All disclosure of this application is incorporated herein by reference.

BACKGROUND OF THE INVENTION

1. Field of Invention

The present invention relates to semiconductor non-volatile memory. More particularly, the present invention relates to a non-volatile memory with selection gate.

2. Description of Related Art

Flash memory device allows multiple-time erase and program operation inside system. As a result, flash memory is suitable to many of advance hand-held digital apparatuses, such as solid state disks, cellar phones, digital cameras, digital movie cameras, digital voice recorders, and personal digital assistant (PDA), that are demanding a low-cost, high-density, low-power-consumption, highly reliable file memory.

Basically, data flash memory has two typical cell structures. One is double poly NAND type memory cell with poly 1 as floating gate to store charges; and the other one is single poly SONOS cell with SiN as storage node. A conventional NAND flash includes numerous strings of series connected N-channel transistor. Device operation of NAND flash utilizes channel Fowler-Nordheim (FN) mechanism for programming and erasing, and cell size for the NAND type flash memory cell is around 4–5$F^2$, here F represents a critical dimension used in semiconductor fabrication as a dimension reference for describing cell size.

On the other hand, conventional SONOS technology is a NOR type flash memory with buried N+ structure. FIG. 1 is a cross-sectional view, schematically illustrating a conventional SONOS flash memory. Device operation of SONOS cell is adopted channel hot carriers for programming and B—B hot holes for erase. FIG. 2 is top view, schematically illustrating the layout of the memory cell with respect to FIG. 1. In FIG. 1 and FIG. 2, the N-well 102 and the P-well 104 are formed in the substrate 100, such as a P-type substrate. Since the whole flash memory includes memory region and the logic region, the various wells are formed to have the CMOS device. The memory cells are formed in the T(triple)P-well 104 as can be understood by the ordinary skilled artisans. For this kind of flash memory, the bit lines BL0, BL1, . . . , BLm 106 are formed in the substrate with strip doped regions. This kind of design for the bit lines is also called the buried bit line design. FIG. 2 only shows the layout for the bit lines 106 and the word lines 110. The charge storage is achieved by the oxide 108a/nitride 108b/oxide 108c (O/N/O) structure layer 108. The word line 110 also serves as the necessary gate.

The operation mechanisms for above cell design in programming, reading and erasing operations are shown in FIG. 3. The word line (WL) is also the gate electrode. The adjacent two bit lines serve as the source/drain (S/D) region in the substrate. The oxide/nitride/oxide (O/N/O) structured layer is between the gate electrode and the substrate, in which the nitride layer is used to store the charges. Due to the charges in the nitride layer basically not moving, the injected charges can be localized in the nitride layer. Therefore, according to the voltages applied on the bit lines, for example for the programming operation at the top two drawings. For the operation shown in left drawing, due to the hot electrons, desired charges are stored in the nitride layer, in which the charges are localized at the one side. However, for the reversed direction shown the right drawing, the charges are stored in the nitride at the left side. Then, for the reading operation, according to the reading direction, the two sides can be separated read. The stored charges change the threshold voltage, so that the stored binary data can be sensed. The erasing operation is to inject the band-to-band (B—B) holes to the nitride layer to neutralize the electrons, so as to erase. Basically, The programming operation is to change the threshold voltage from low to high, and the erasing operation is to change the threshold voltage from high back to low. The operation should be well known by the skilled artisans and the detailed description is skipped.

However, the conventional SONOS flash memory has the disadvantages. As shown in FIG. 3, charges in nitride layer may laterally diffuse between twin bits in SONOS cell. This is because the straight nitride layer still has insufficient power to localize the store charges. When some of the stored charges drift to the other side, at which no charge is expected, the bit error would occur. In addition, the hot carriers for programming consumes a larger current that can't support page mode programming.

SUMMARY OF THE INVENTION

The invention provides non-volatile memory device, which has split gate design with capability to effectively prevent the bit error from occurring. Also and, the charges can be well localized at the desired location, the operation current can be reduced.

A structure of non-volatile memory contains a substrate, having a doped well. A plurality of bit lines are formed in the substrate along a first direction, wherein each of the bit lines also serve as a source/drain (S/D) region. A first dielectric layer is disposed on the substrate. A plurality of selection gate (SG) lines are formed on the first dielectric layer between the bit lines. A second dielectric layer (Cap SiN or Cap oxide) is formed over SG lines to isolate SG line and word lines. A plurality of charge-storage structure layers are formed over the substrate between the bit lines and the SG lines. A third dielectric layer is formed over Bit lines to isolate Bit lines and word lines. A plurality of word lines are formed over the substrate along a second direction, which is crossing the first direction for the bit lines.

In another aspect, the invention provides a structure of a non-volatile memory unit with two-bit memory capacity, which comprises a substrate and two doped lines, located in the substrate. A selection gate structure line is disposed on the substrate between the two doped lines. A charged storage structure layer is located each side of the selection gate structure line between the doped lines and the selection gate line. A second dielectric and third dielectric layer are disposed on the selection gate structure line and the doped lines. Also and, a gate electrode layer is disposed crossing over the doped lines and the selection gate structure line.

For another aspect, a circuit layout for a non-volatile memory device comprises a plurality of MOS memory cells, arranged into rows and columns, wherein each of the MOS memory cells has two charge storage nodes commonly coupled with one selection gate (SG) line corresponding to the columns. A plurality of buried bit lines are coupled between adjacent two of the memory cells, to also serve as S/D electrodes of the memory cells. A plurality of word lines are coupled to the memory cells with respect to the rows and also act as gate electrode of memory cells. At least two SG voltage feeding lines, wherein the SG lines are alternatively coupled to the SG voltage feeding lines. Wherein, when the SG voltage feeding lines are applied a activating voltage, a created S/D region occurs between the two charge storage nodes, so that a proper source voltage or in floating can be applied to the created S/D region to operate with the S/D electrode from the bit lines.

For another aspect, the foregoing at least two SG voltage feeding lines includes two or three SG voltage lines.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a drawing, schematically illustrating the operation mechanism for the conventional non-volatile memory in FIG. 1.

FIGS. 8A–8J are circuit diagrams, schematically illustrating the operation of non-volatile memory based on FIG. 4, according to various embodiments of the invention.

FIGS. 9A–9B are cross-sectional view, schematically illustrating the leakage current improvement of another embodiment that are described in FIGS. 8I and 8J.

DESCRIPTION OF THE PREFERRED EMBODIMENTS

In the invention, a novel structure of non-volatile memory is proposed. In the invention, selection gate (SG) lines are for example in the middle of a memory cell with separated two charge storage films over the substrate between the bit line and SG line, and preferably also on the sidewall of the SG line. When the selection gate lines is applied a voltage, the substrate at the corresponding region become an inversion region, which can serve as a S/D region. In this design, the storage charges can be well localized to the desired region in the charge storage layer, such as the nitride layer.

Figure 1:
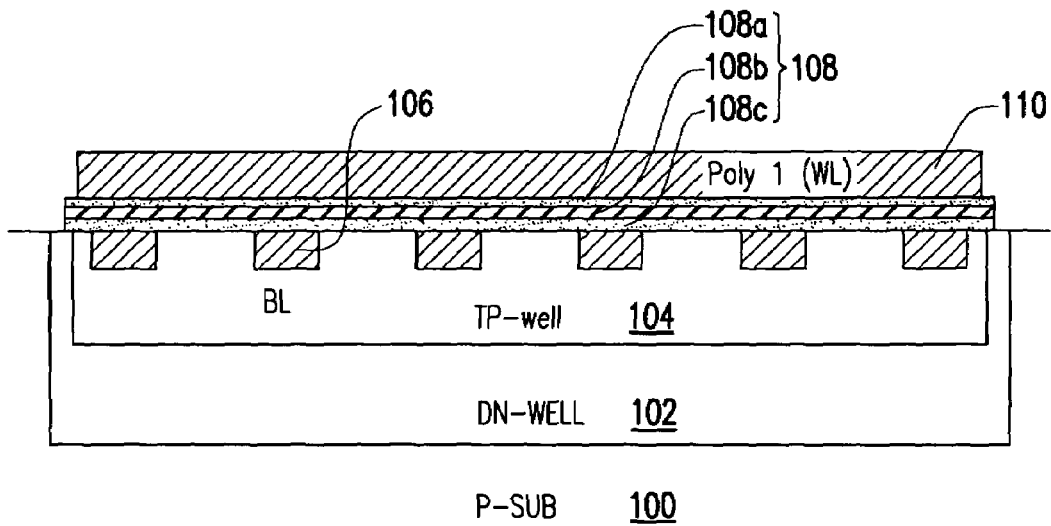
FIG. 1 is a cross-sectional view, schematically illustrating a conventional SONOS flash memory.
Figure 2:
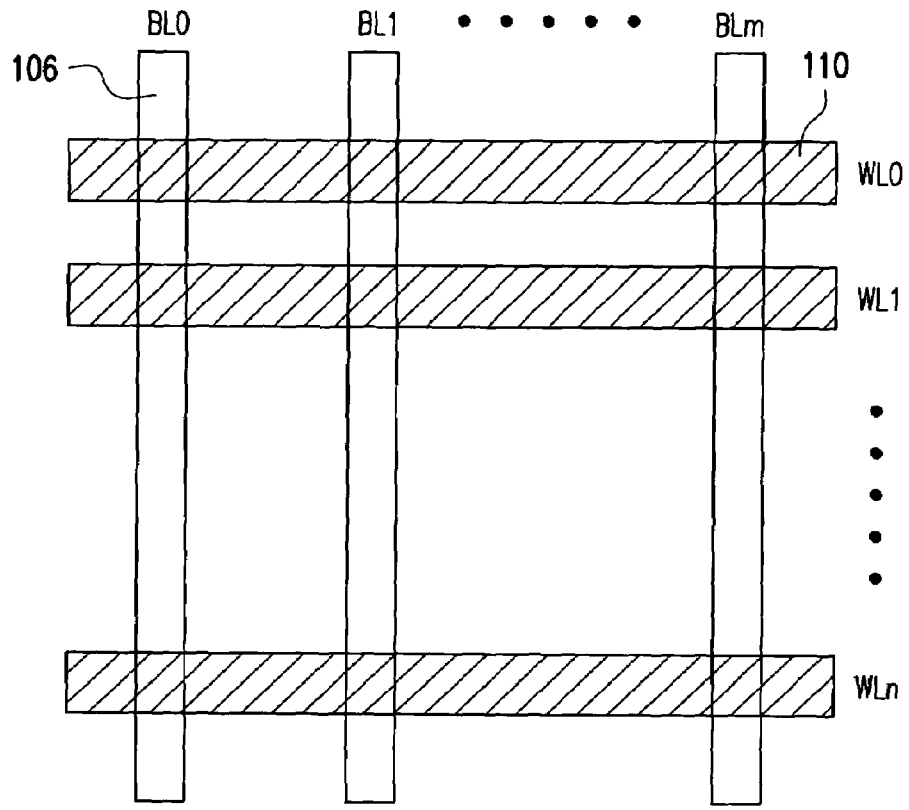
FIG. 2 is a top view, schematically illustrating the layout for the bit lines and word lines with respect to FIG. 1.
Figure 4:
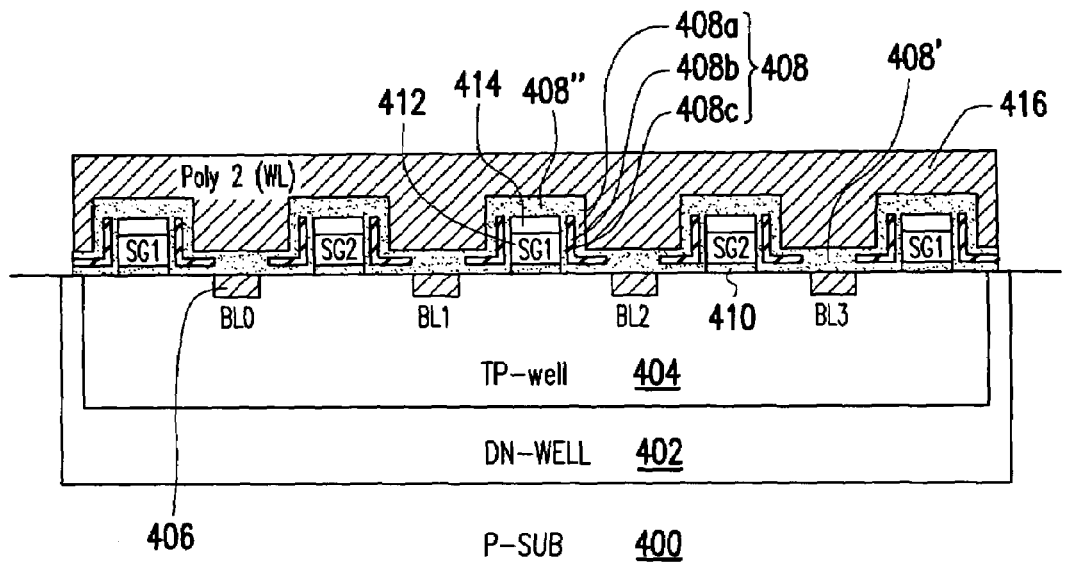
FIG. 4 is a cross-sectional view, schematically illustrating a novel non-volatile memory, such as flash memory, according to an embodiment of the invention.
Figure 5:
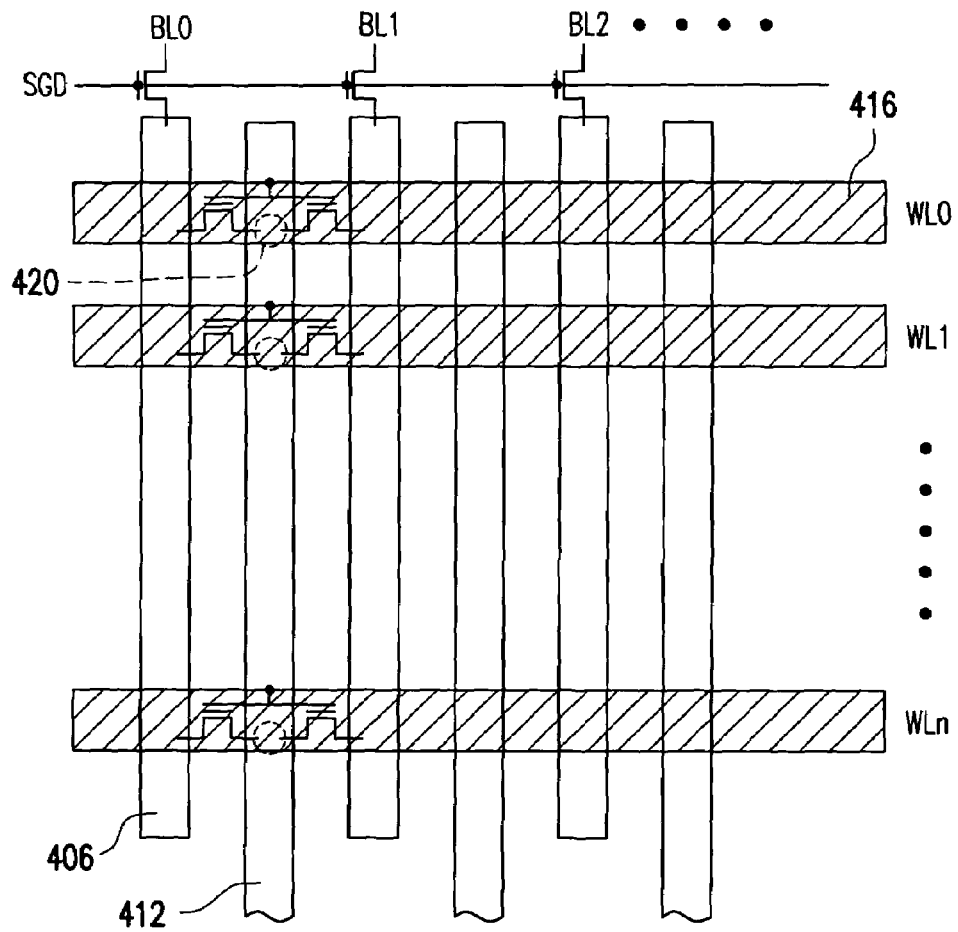
FIG. 5 is a top view, schematically illustrating the layout for the bit lines and word lines with respect to FIG. 4, wherein an equivalent circuit is shown.

FIG. 4 is a cross-sectional view, schematically illustrating a novel non-volatile memory, according to an embodiment of the invention. FIG. 5 is a top view, schematically illustrating the layout for the bit lines and word lines with respect to FIG. 4. In FIG. 4, for a P-type substrate 400 as an example, several different-type wells 402, 404 are formed in the substrate 400. In general, the memory device having the memory region and the logic region is formed by the CMOS design. In the embodiment, the N-type memory cell is illustrated. However, with the same design principle introduced by the invention, the different semiconductor conductive type can also be applied.

Several bit lines 406 (BL0, BL1, . . . . BL4, . . . ) are formed in the substrate 400 within the P-type well 404. The bit lines 406 are the doped regions formed in the substrate 400, also called the buried bit lines. The bit lines 406 are extending along one direction perpendicular to the drawing sheet. Wherein, for the actual operation, the bit lines can be alternatively arranged to serves as two S/D regions for one memory cell in operation. Here, for one memory cell, it has two-bit memory capacity. A dielectric layer 410, such as gate oxide layer, is formed on the substrate 400. Multiple selection gate (SG) lines 412 are formed on the dielectric layer 410 between the bit lines 406. The SG lines 412, in consideration of applying voltages with respect to voltage source VS in operation, are for example arranged to have first-group SG lines (SG1) and second-group SG lines (SG2). However, this is not the only option. Since the a word line 416 is to be formed later, a cap layer 414 is preferably formed on SG 412 to improve the isolation from the word line 416.

In order to have the function to store the charges, several structure can be adapted. Here, the oxide/nitride/oxide (O/N/O) structure layer 408 is used as the example for descriptions. For the O/N/O design, a dielectric layer such as the oxide layer 408c is formed over the substrate 400 and covers over the sidewall and the top portion of the SG layer 412 and cap layer 414. Then, the charge-trapping dielectric layer 408b is formed over the dielectric layer 408c. The charge-trapping dielectric layer 408b at the region above the bit line 406 can be continuous or discontinuous according to the actual fabrication processes. Here, the discontinuous situation is shown in FIG. 4. The charge-trapping dielectric layer 408b usually is a nitride layer, such as silicon nitride. However, any dielectric layer with capability to trap charges can also be used, such as tantalum oxide, aluminum oxide, or nano-crystal silicon.

Another dielectric layer 408a, such as oxide layer, is formed over the substrate on the charge-trapping dielectric layer 408b. Then, the dielectric layer 408a, 408b and 408c are called the dielectric layer 408. The similar situation also occurs at the region above the bit line 406 and dielectric cap layer 414, and are called dielectric layer 408' and 408" respectively. From the structure point of view, the structure of dielectric layers may be different according to the actual fabrication processes. The dielectric layers 408' and 408 can have other option. The discontinuous design for the charge-trapping dielectric layer 408b is helpful to further improve the localization for the stored charges, as also to be described later about the operation mechanism in FIGS. 7A–7F.

FIG. 5 shows a part of the top view with the circuit equivalent. Here, since the word line 416 also serves the gate in memory cell between two bit lines, one common gate with two bits is shown. The region 420 in the substrate is corresponding to SG line to be turned on/off. In other words, the region 420 is virtually existing in the substrate, and is to be created when a proper voltage is applied to create the inversion region in semiconductor properties.

In this design, when the SG line 412 is applied a voltage, an inversion region (not shown) is created in the substrate 400 under the SG line 412. This inversion region serves as another S/D region. In other words, the S/D region does not appear until the selected SG line is applied with the working voltage. Two charge storage regions, as two bits, are located at side regions of the SG line 412 with the same cell gate electrode between adjacent two bit lines 406 (contributed form the word line 416). The size of charge storage region is about 0.5 F, while the width of the SG line is about 1 F. Therefore, there two bit in one memory cell is formed between two adjacent bit lines, in which the SG line is commonly used by the two memory bits, as equivalently shown in FIG. 5.

Figure 6A:
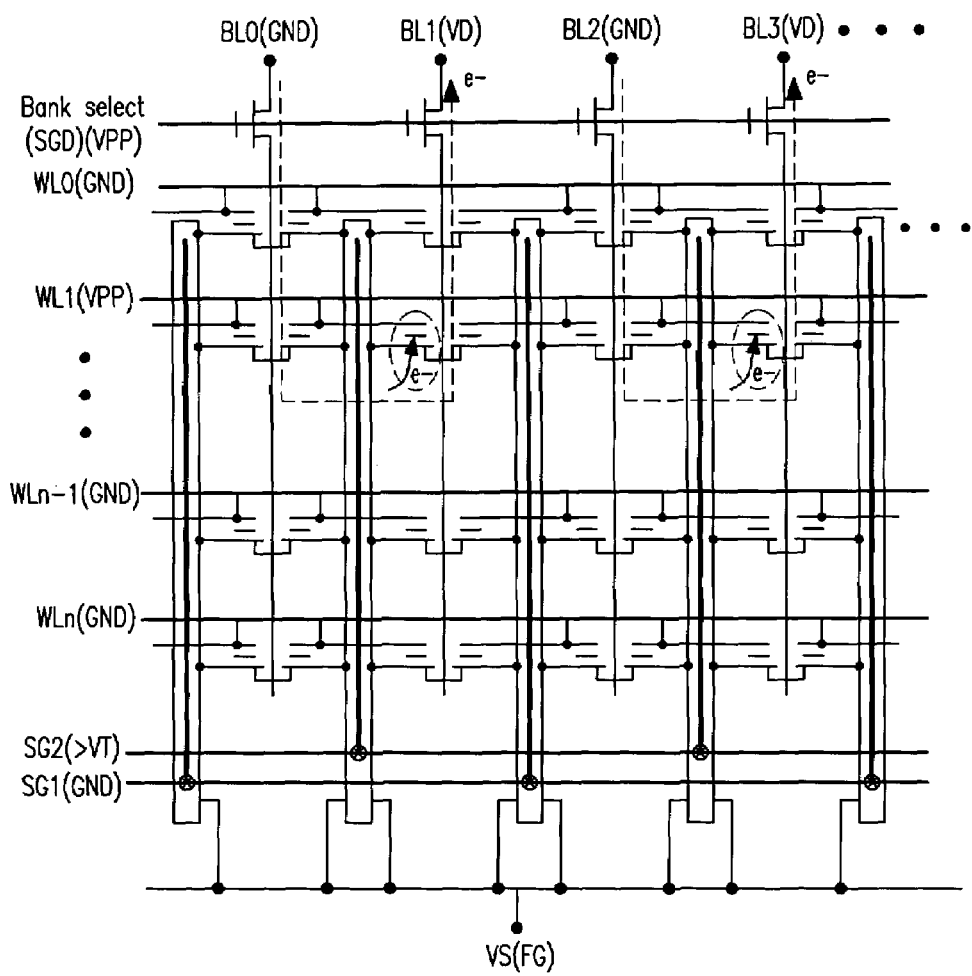
FIGS. 6A–6B are circuit diagrams, schematically illustrating the equivalent circuit of non-volatile memory with respect to FIG. 4, according to an embodiment of the invention.
Figure 6B:
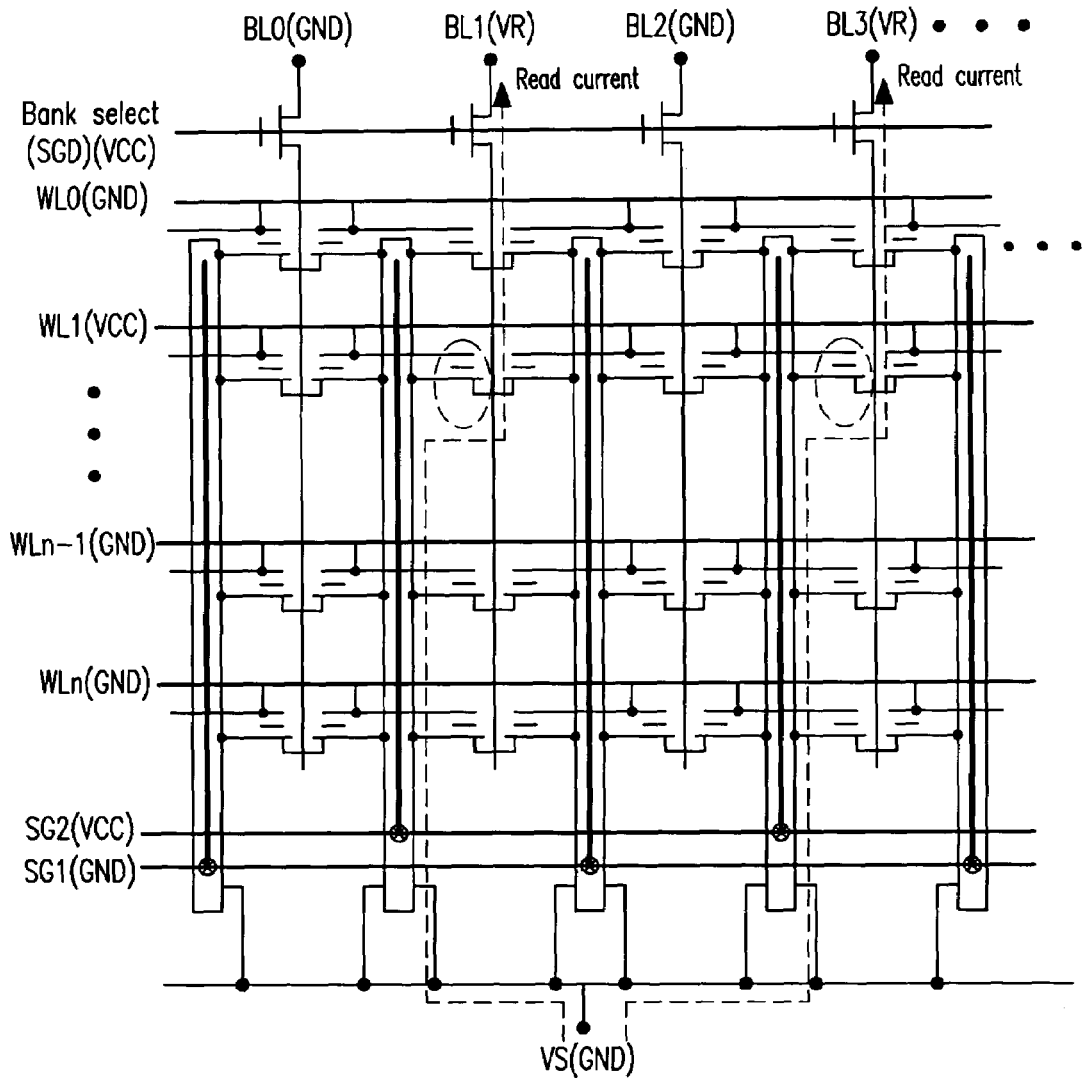

FIG. 6 is a circuit diagram, schematically illustrating the equivalent circuit of nonvolatile memory with respect to FIG. 4, according to an embodiment of the invention. In FIG. 6, the bit line can also coupled with a bank-selection transistor (SGD). When the bank-selection transistor is turned on, the bit line voltage can be passed to the memory cells coupled to the bit line. Then, the memory structure unit has a SG line and charge storage nodes. When the SG line is applied with a voltage, the desired S/D region is created in the substrate as previously described in FIG. 4. This S/D region is usually called the source region. Then, a source voltage Vs is applied to the created source region, which is represented by a rectangular. In this embodiment, the SG lines are the voltage-feeding lines to feed desired voltage to the SD lines.

The SG lines SG1 and SG2 can be applied with the proper voltage to turn on/off the S/D region, so as to select the desired memory cell. FIGS. 7A–7F are cross-sectional views, schematically illustrating the operation mechanism for the structure in FIG. 4, according to an embodiment of the invention.

Figure 7A:
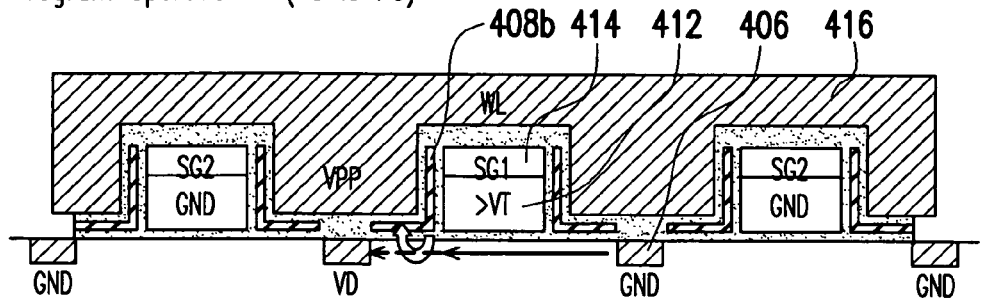
FIGS. 7A–7F are cross-sectional views, schematically illustrating the operation mechanism for the structure in FIG. 4, according to an embodiment of the invention.

In FIG. 7A, the program operation can be performed by applying a voltage greater than a threshold voltage VT on the selected SG line (SG1) but the source voltage Vs is floating. In this situation, one bit line serving as a drain electrode VD is applied with a working voltage VPP, and the other bit lines are applied with a ground voltage. In this situation, carrier charges, such as electrons, are driven to the drain electrode VD as indicated by the straight arrow. However, some electrons are trapped into the nitride layer 408b at the horizontal portion as indicate by the curved arrow. Here, since the portion of the nitride layer 408b at the sidewall of the SG line is in perpendicular to the horizontal portion, the carrier electrons are not easy to move up. Therefore, the charges do not affect the opposite cell at the other sidewall of the SG line. Therefore, the trapped charges are well localized at the desired portion of the nitride layer 408b.

Figure 7B:
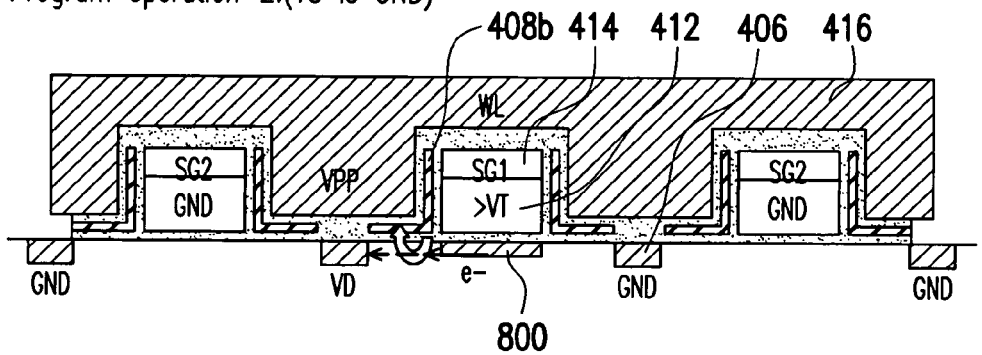

The programming operation can also be operated as shown in FIG. 7B. Here, the source voltage is applied to the created S/D region under the SG line. Then the electrons drift from the created S/D region 800 with the about the same effect.

Figure 7C:
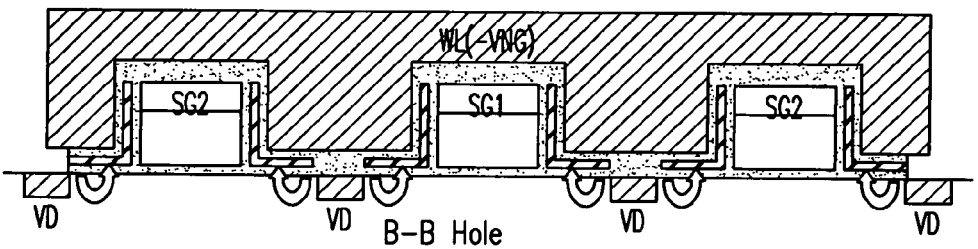
Figure 7D:
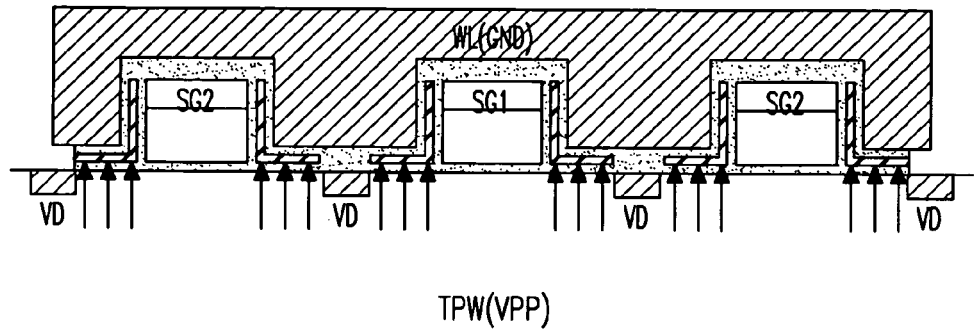

In FIGS. 7C–7D, the erasing operation are shown. FIG. 7C shows the mechanism by band-to-band (B—B) holes, which are injected into the nitride layer to neutralize the trapped electrons. In this situation, the bit lines are applied a relative high positive voltage, while the word line is applied by a relative negative voltage. Alternatively, FIG. 7D shows the FN erasing operation by driving holes from the substrate to the nitride layer by applying a relative high voltage VPP on the substrate.

Figure 7E:
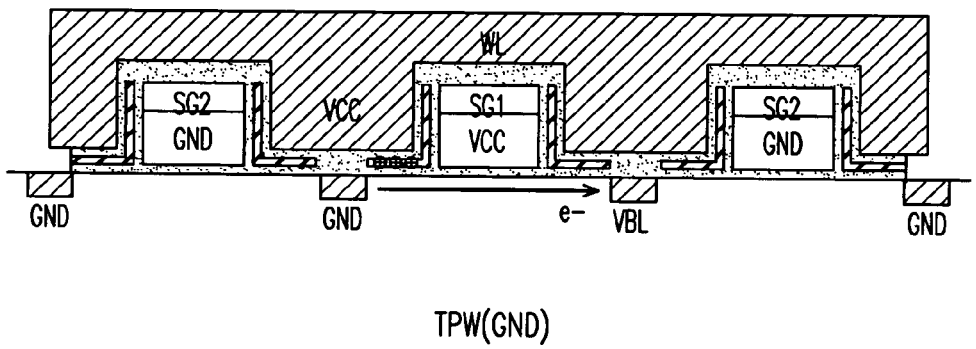
Figure 7F:
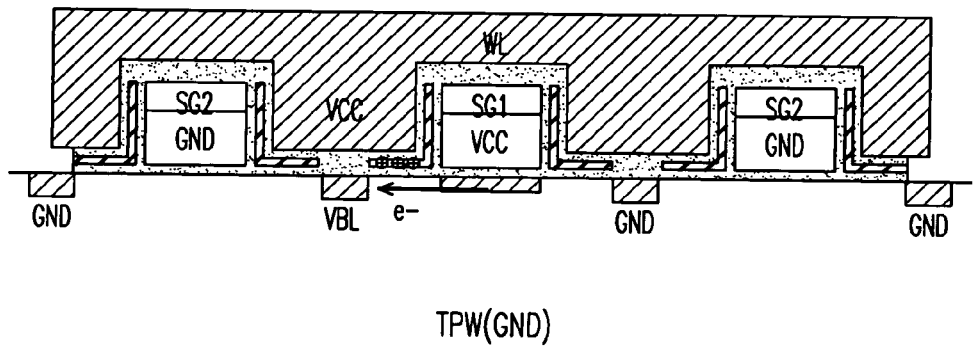

In FIGS. 7E–7F, the reading operation is, for example, achieved by two ways. FIG. 7E shows the reading operation by setting the source voltage Vs to be floating. In this situation, electrons are driven from the grounded bit line to the adjacent bit line with a voltage of VBL. Due to the trapped charges in the nitride layer, the threshold voltage for the memory cell is changed. This causes the sensing current to be different in reading operation. Then, the binary data can be read. FIG. 7F shows another way to read the cell. IN this operation, the created S/D region 800 is also grounded. Then, the electrons are driven from the created S/D region 800.

The programming, reading and erasing operations illustrated above are just the example. The actual operations can be changed by applying other proper set of voltages on the electrode terminals. The invention introduces the SG line, which can create the addition S/D region to the bit lines. As a result, the operations can be achieved in various ways with fast operation. In the invention, the SG line is proposed. However, for the actual operation to select the desired memory cell, the source voltage can be applied in various designs in different circuit.

Figure 8A:
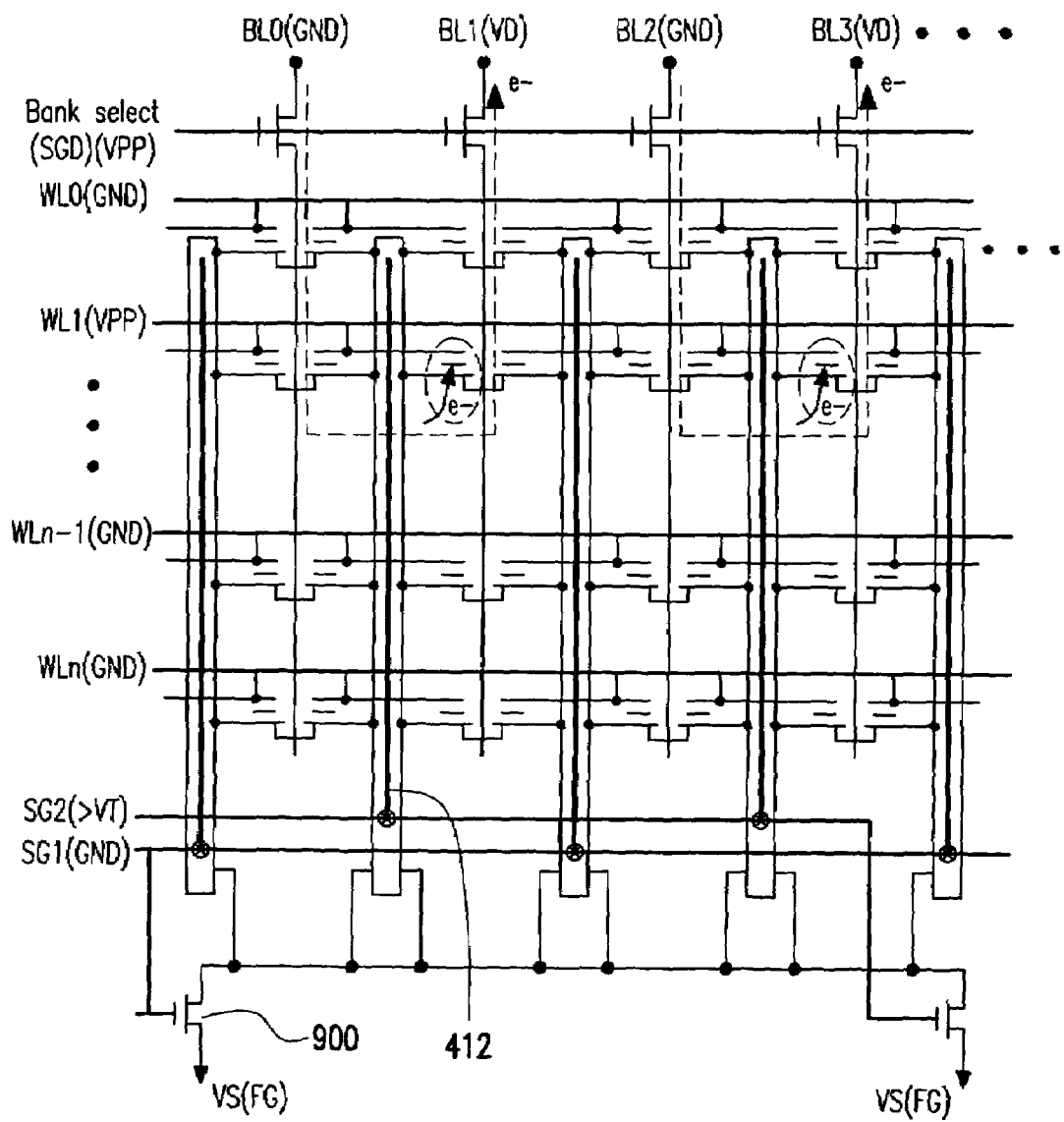
Figure 8B:
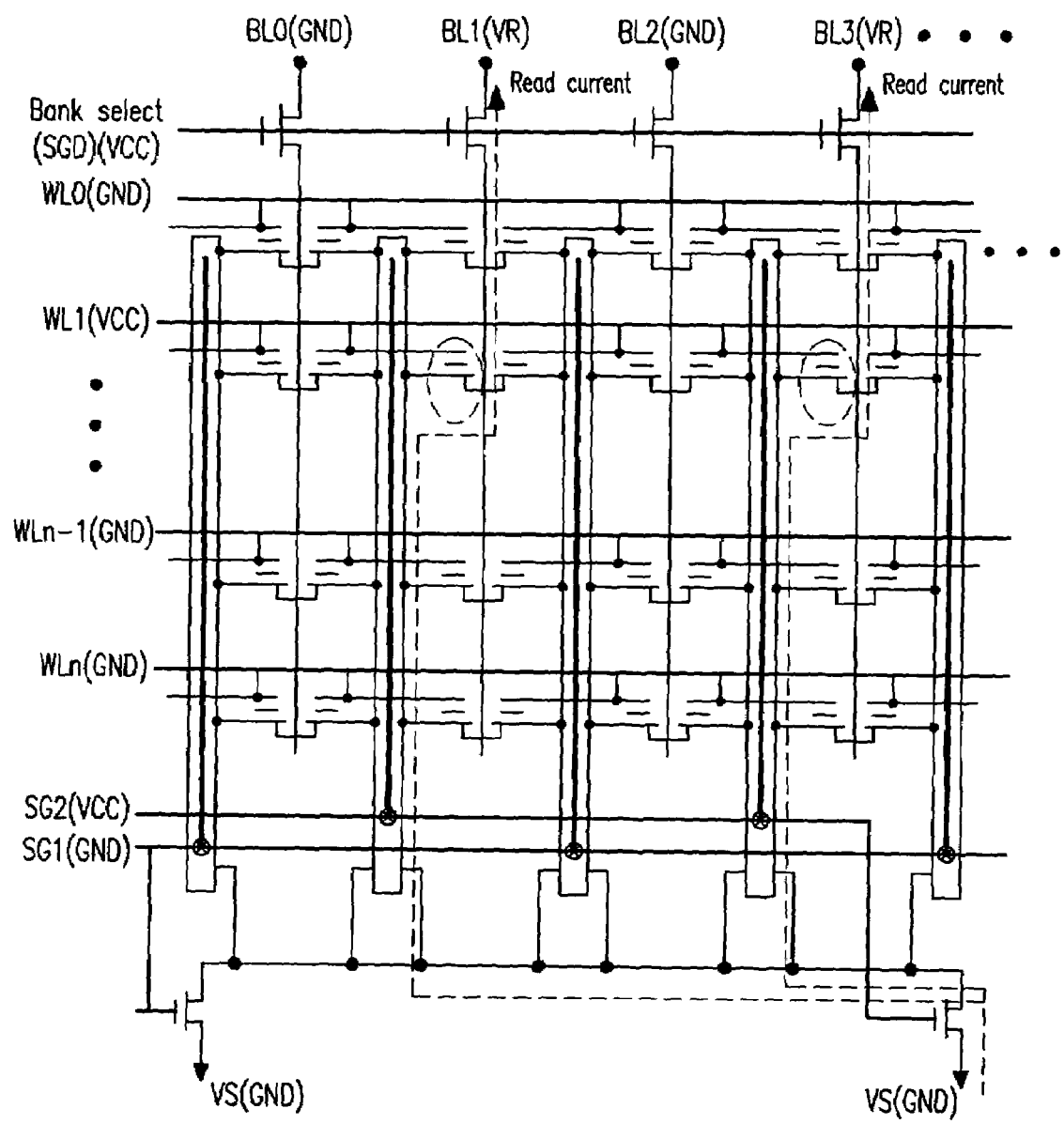

FIGS. 8A–8J are circuit diagrams, schematically illustrating the operation of non-volatile memory based on FIG. 4, according to various embodiments of the invention. In FIG. 8A, if the memory cell indicated by the dashed circle is to be programmed, then the bit line BL1 is applied a voltage VD. The SG line SG2 is applied with a voltage, such as a voltage greater than the threshold voltage VT with respect to the select gate. Then, an inversion region under the select gate in the substrate is created to serve as the S/D region, which also behaves like a channel region to pass the external applied voltage. Two transistors 900 are included for control the voltage to the created S/D region. In the example, since SG2 has the voltage while SG1 is grounded, which are also connected to the gate electrode of the transistors 900, one transistor is turned on. Then, if the source voltage is set to be floating state, then the electrons are injected into the memory cells as by the path indicated by dashed arrow. In FIG. 8B, a read operation on the same programmed cell is performed. In this situation, after applying the proper set of operation voltages, the read path is formed as indicated by the dashed arrow. The operation voltages shown in FIG. 8B are just the example. It is not necessary to be restricted to the voltage setting in FIGS. 8A–8B.

Table 1 is an example for the sets of voltage with respect to various operation including programming, reading, and erasing.

TABLE 1

|  | Erase-1 | Erase-2 | Program-1 | Program-2 | Read-1 | Read-2 |
| --- | --- | --- | --- | --- | --- | --- |
| BL0 | VD | FG | GND | GND | GND | GND |
| BL1 | GND | FG | VD | VD | VR | VR |
| BL2 | VD | FG | GND | GND | GND | GND |
| BL3 | GND | FG | VD | VD | VR | VR |
| SGD (Bank select) | VPP1 | FG | VPP1 | VPP1 | VCC | VCC |
| WL1 | −VNG | GND | VPP1 | VPP1 | VCC | VCC |
| SG1 | FG/GND | FG | >VT | >VT | VCC | VCC |
| SG2 | FG/GND | FG | GND | GND | GND | GND |

TABLE 1-continued

|  | Erase-1 | Erase-2 | Program-1 | Program-2 | Read-1 | Read-2 |
|---|---|---|---|---|---|---|
| VS | GND | FG | GND | FG | FG | GND |
| Unselected SGD | GND | FG | GND | GND | GND | GND |
| Unselected WL | GND | GND | GND | GND | GND | GND |
| TP-WELL | GND | VPP | GND | GND | GND | GND |

In Table 1, for example, VPP value is from 8 to 20 V; VD value is from 3 V to 7 V; -VNG is from −2 V to −10 V; VPP1 is from 4 V to 12 V; and VR is from 0.6 V to 2 V. It should be understood that this table 1 is just an example for operation but not the only choice.

Figure 8C:
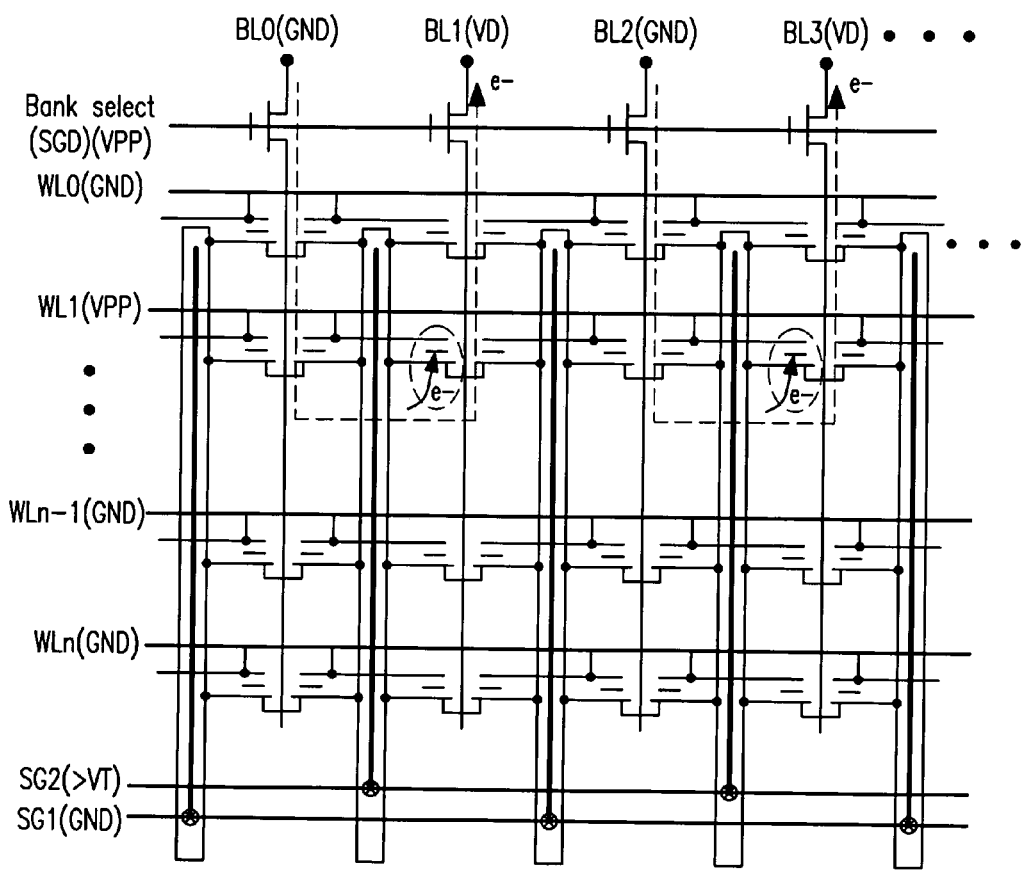
Figure 8D:
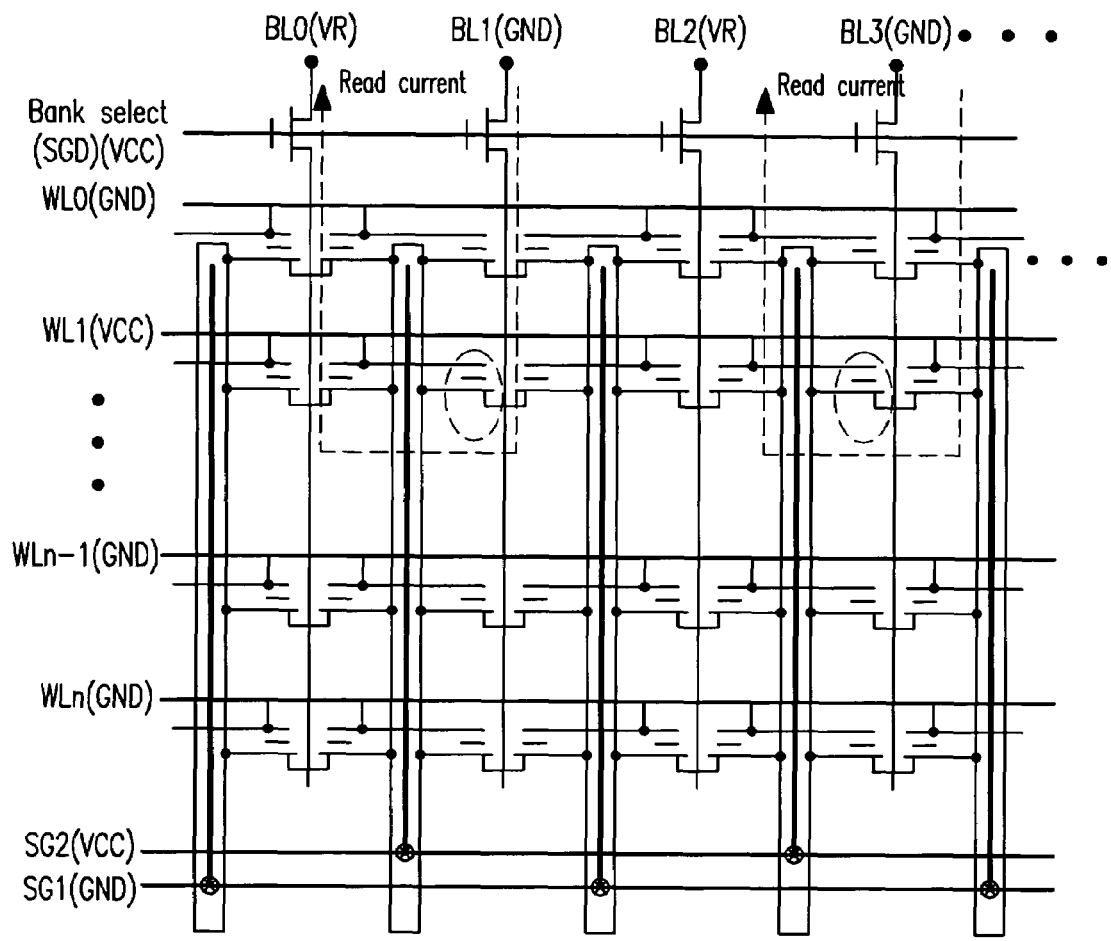

In FIGS. 8C–8D, another circuit design is provided as the example. In this example, the source voltage keeps floating. In FIG. 8C, the memory cell is programmed as indicated by the dashed line. In FIG. 8D, the programmed memory cell is read following the path indicated the dashed line.

Figure 8E:
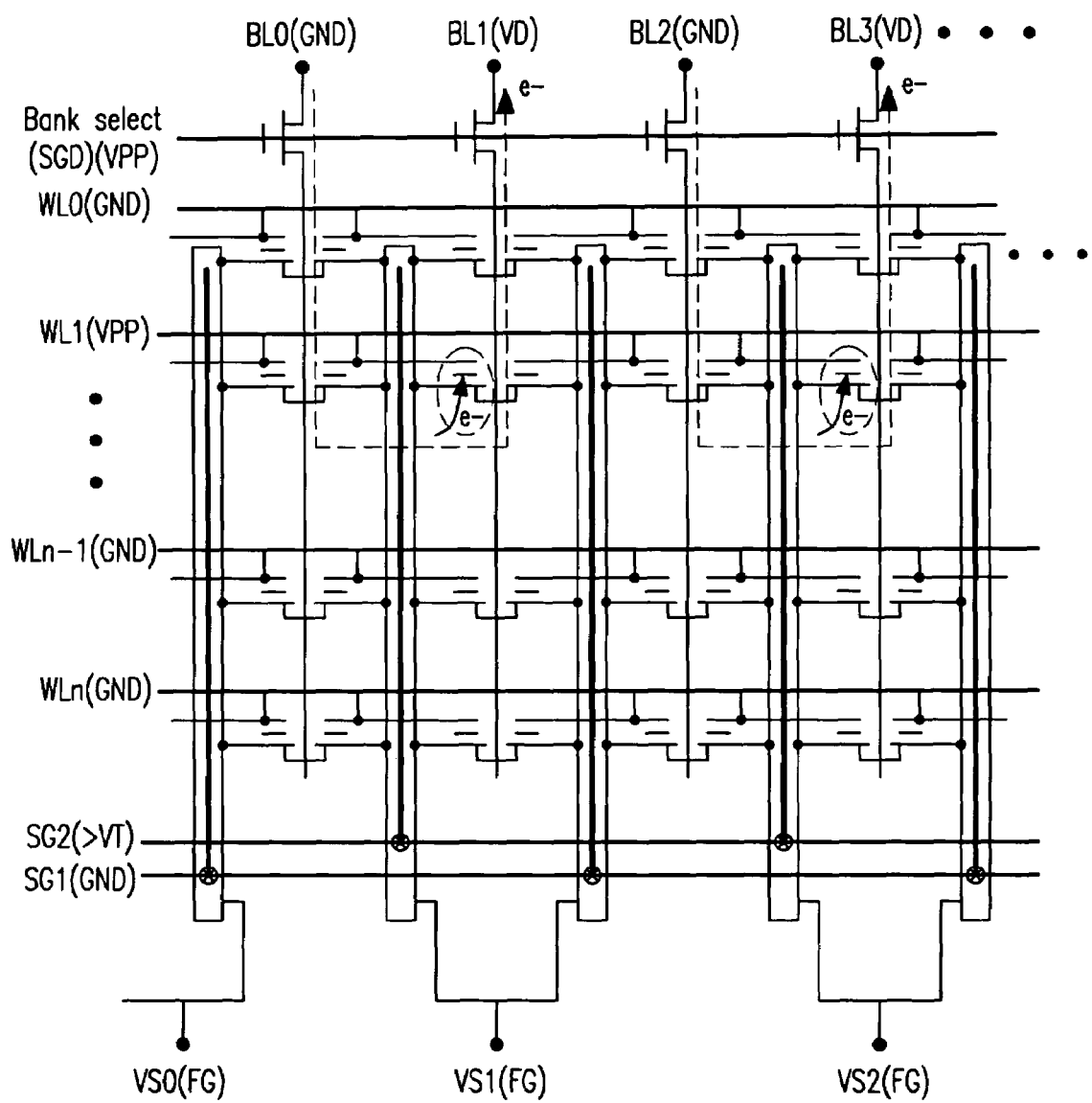
Figure 8F:
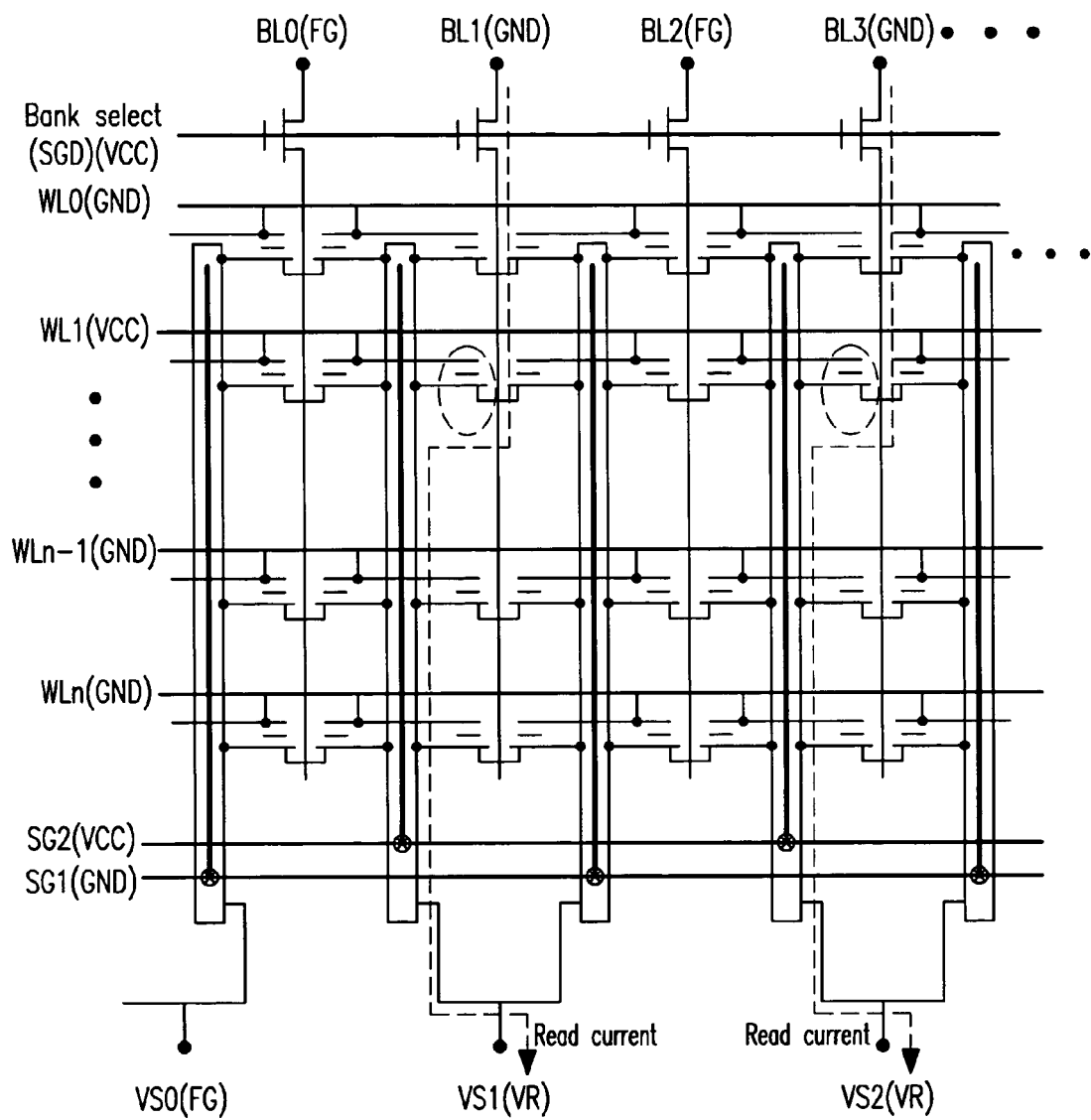

In FIGS. 8E–8F, another circuit design is provided as the example. In this example, several source voltage terminals VS0, VS1, VS2, . . . are included. Each source voltage terminal is coupled with two adjacent virtual S/D regions, which are in the substrate under the SG lines, which are applied voltages by two voltage feeding lines SG1 and SG2. In FIG. 8E, the programming operation is illustrated. The source voltages are floating. In FIG. 8F, the source voltage VS is applied with a read working voltage VR, then the read path is formed.

Figure 8G:
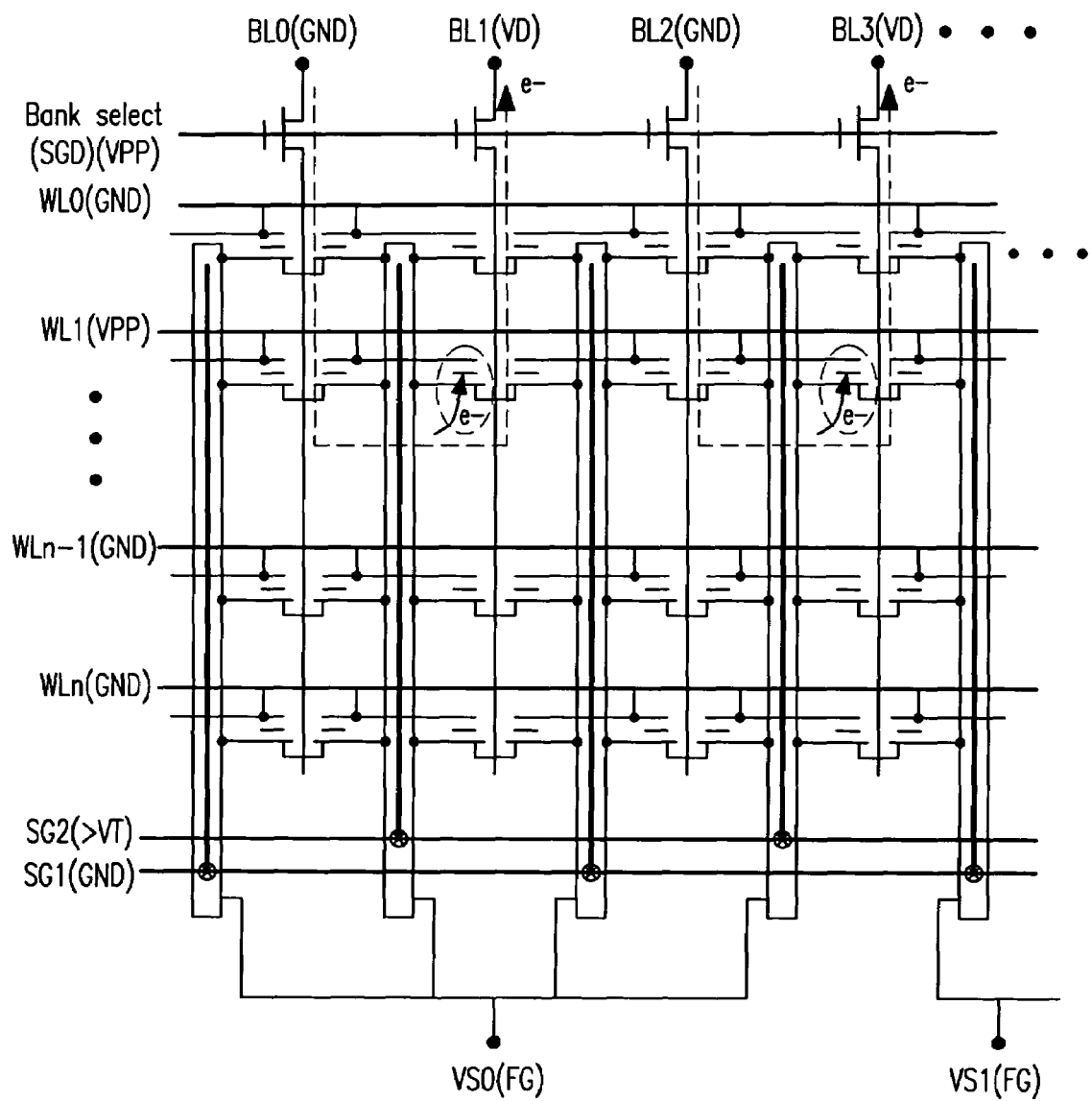
Figure 8H:
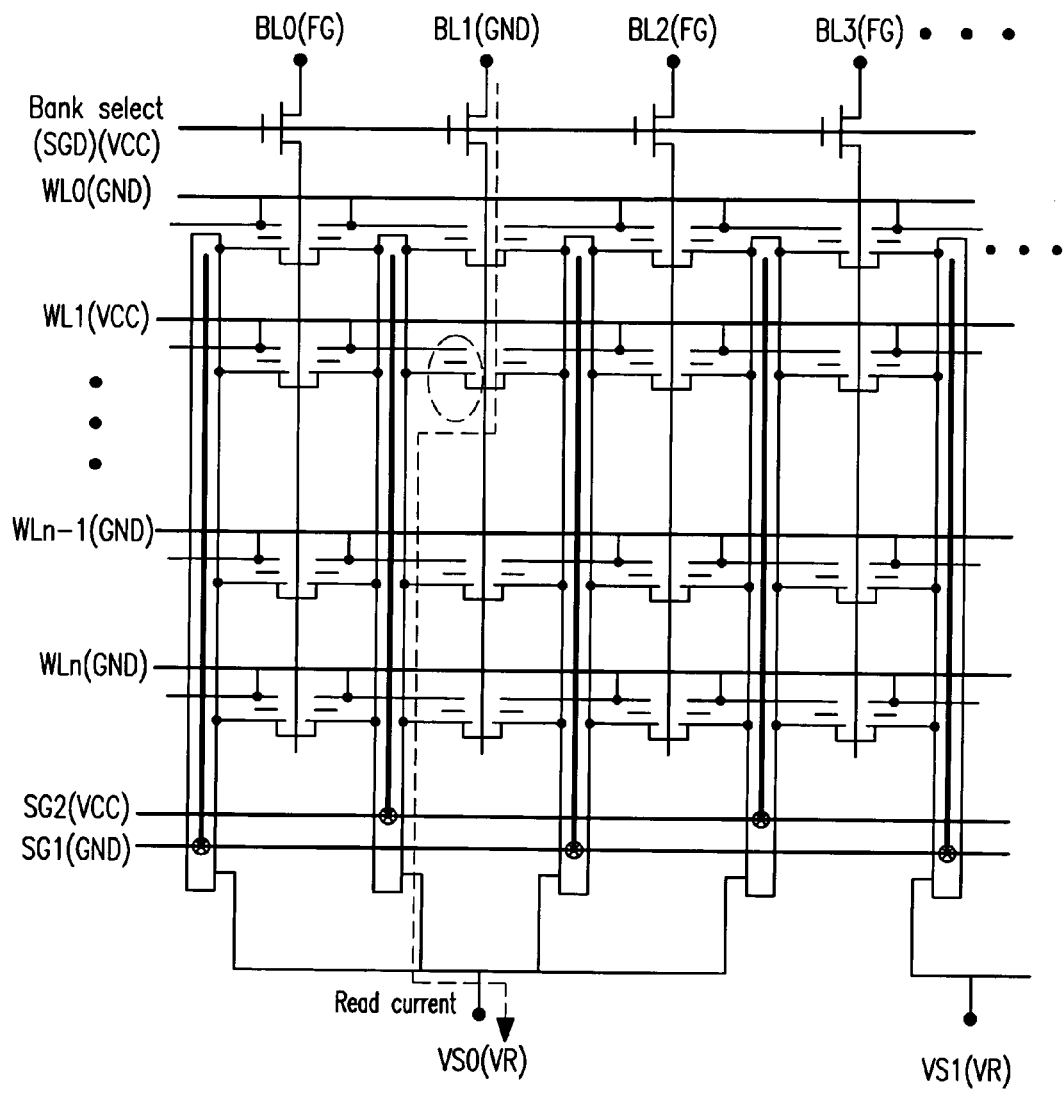
Figure 81:
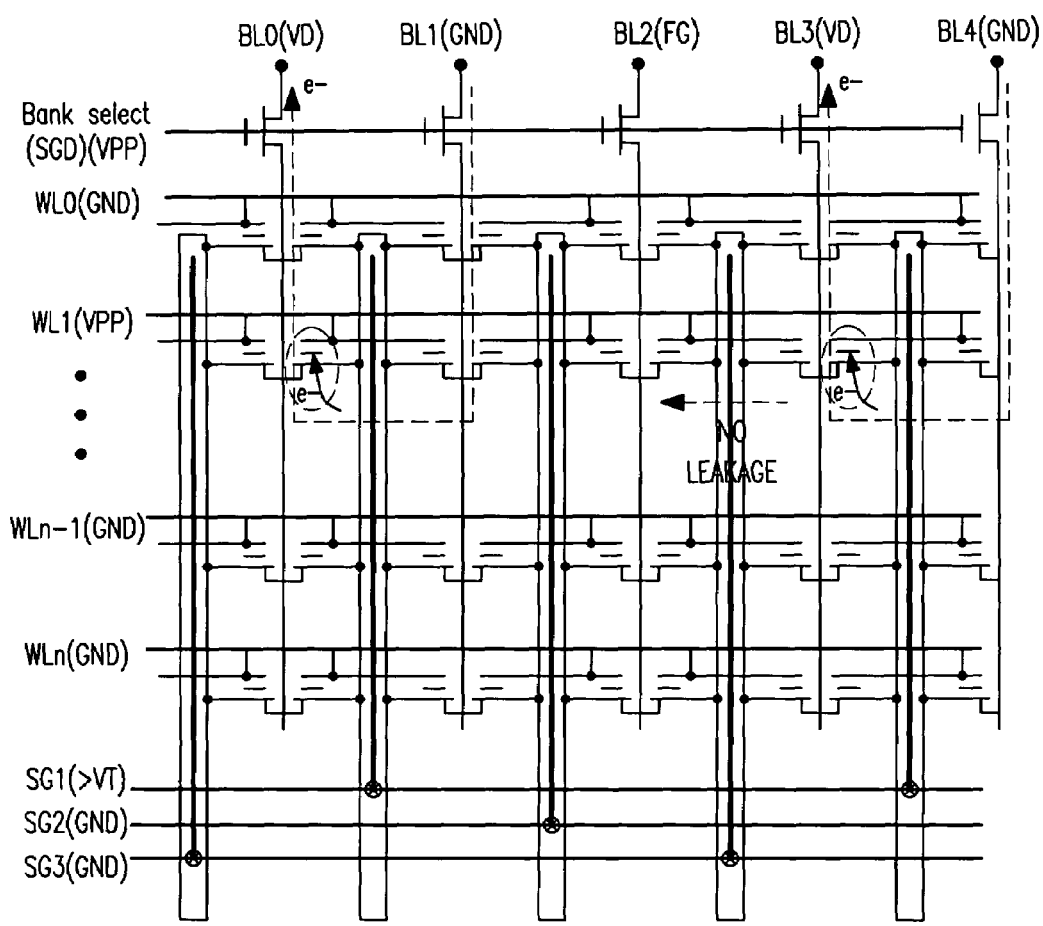

In FIGS. 8G–8H, another circuit design is provided as the example. In this example, several source voltage terminals VS0, VS1, . . . are included. However, one voltage terminal is coupled with four virtual S/D regions. In FIG. 8G, the programming operation is shown, in which the source voltage is at floating state. In FIG. 8H, the reading operation is shown. The source voltage terminal VS are set to the read working voltage VR. Due to the difference between the read operation and the programming operation, the voltages applied to the bit lines are accordingly different.

Figure 8J:
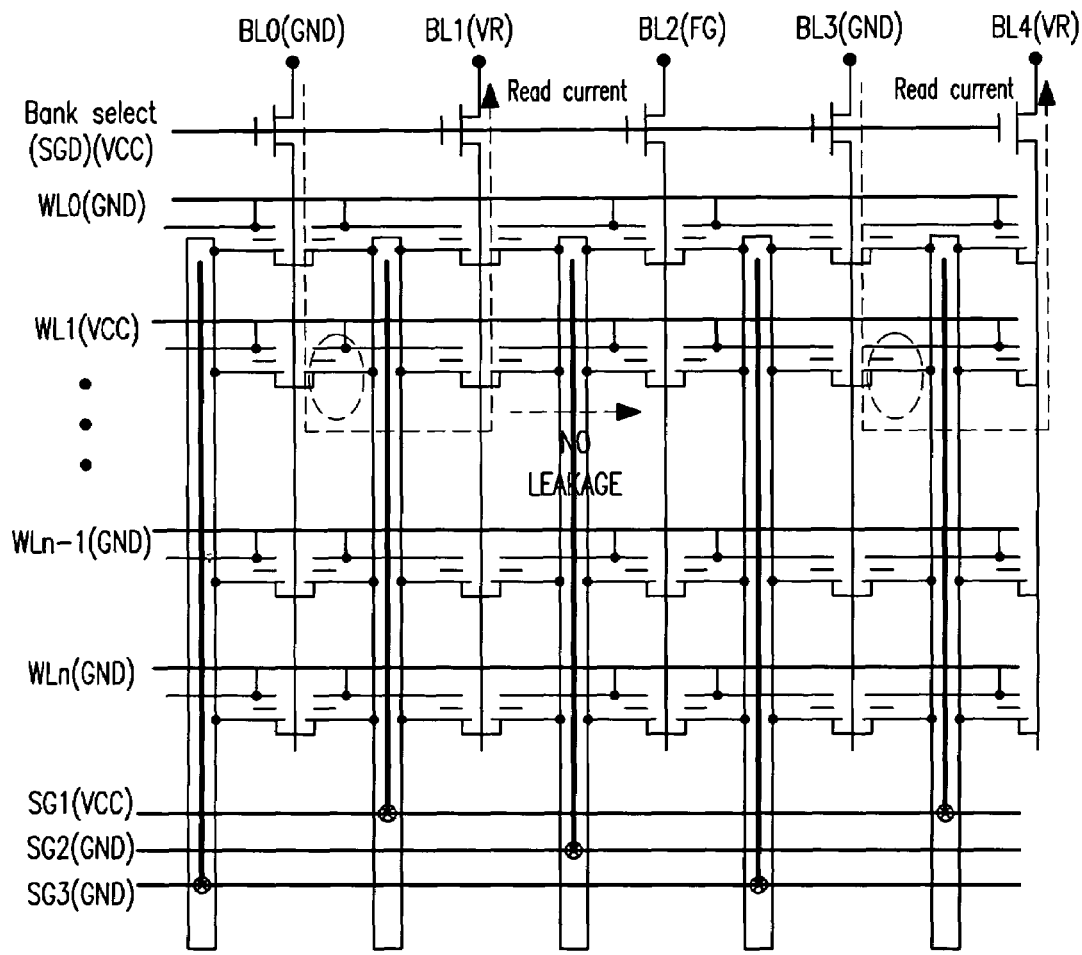

Again in FIGS. 8I–8J, three voltage-feeding lines SG1, SG2, and SG3 are used. This arrangement can reduce the potential leakage as to be described in FIGS. 9A–9B. In FIG. 8I, the programming operation can be performed to have the path as indicated by dashed line. In FIG. 8J, the reading process can also achieved by applying another set of the read working voltage on the related bit lines, such as BL0, BL1, and BL2 as a memory controlled unit.

The designs in FIGS. 8I–8J with three SG voltage-feeding lines have at least some advantages as shown in FIGS. 9A–9B. If it is necessary, the SG voltage-feeding lines can be more than three. In FIG. 9A, a program leakage current may occur as indicated with circle when two select gate lines are used. Basically, the program leakage should be reduced by applying GND voltage at the gate of non-selected select transistor to turn off leakage current. However, the leakage will increase when channel length of select gate transistor is decreasing. On the other hand, read leakage current also exists when channel length of select gate transistor is decreasing. In order to reduce the forgoing issues, the three-gate arrangement in FIGS. 8I–8J is proposed. The operation mechanism is shown in FIG. 9B. In FIG. 9B, the phenomenon of device having punch through to adjacent cells is reduced by using the three-SG design. By way of the operation in FIGS. 8I–8J, the source voltages for the SG1 can be properly set while the other two lines of SG2 and SG3 are set to ground voltage GND and unselected adjacent bit lines are set to floating, that will turn off the leakage current.

Figure 10:
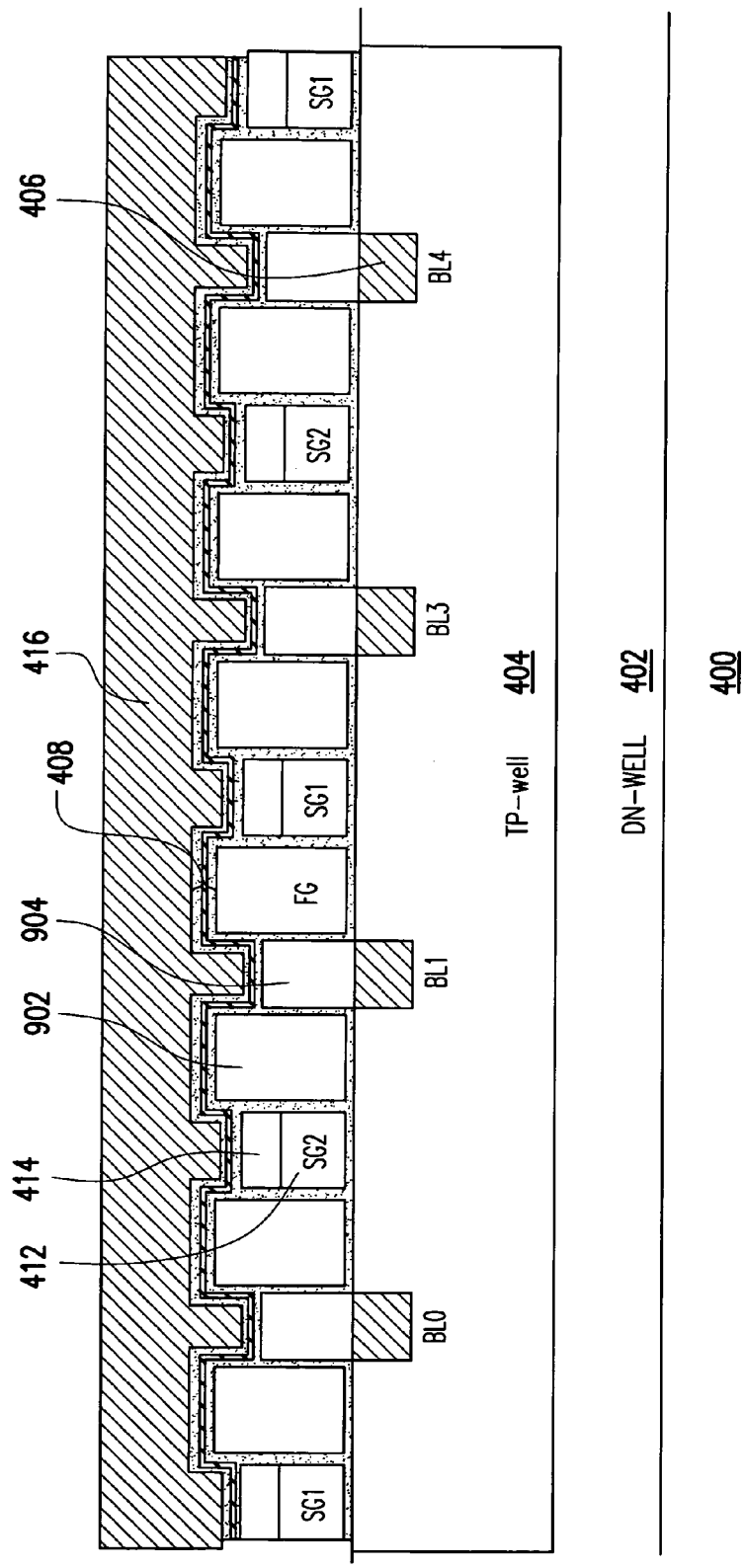
FIG. 10 is cross-sectional view, schematically illustrating novel non-volatile memory devices, according to another embodiments of the invention.

The structure in FIG. 4 is just an example for descriptions. With the same design principle of the invention, the charge storage structure can be changed into other types. For example, FIG. 10 is cross-sectional view, schematically illustrating novel non-volatile memory devices, according to another embodiments of the invention. In FIG. 10, the stack-gate design can be used with the SG. The floating gate 902 is used to store the charges while the SG 412 and the cap layer 414 are also used with the similar function described above. The word line 416 is formed over the substrate 400 and is insulated by the dielectric layer 408, which for example is an O/N/O structure. Also and, a dielectric cap layer 904 can also be formed on the bit line 406. The dielectric cap layer 414 and the dielectric cap layer 904 can be the same material formed at the same time.

Figure 11:
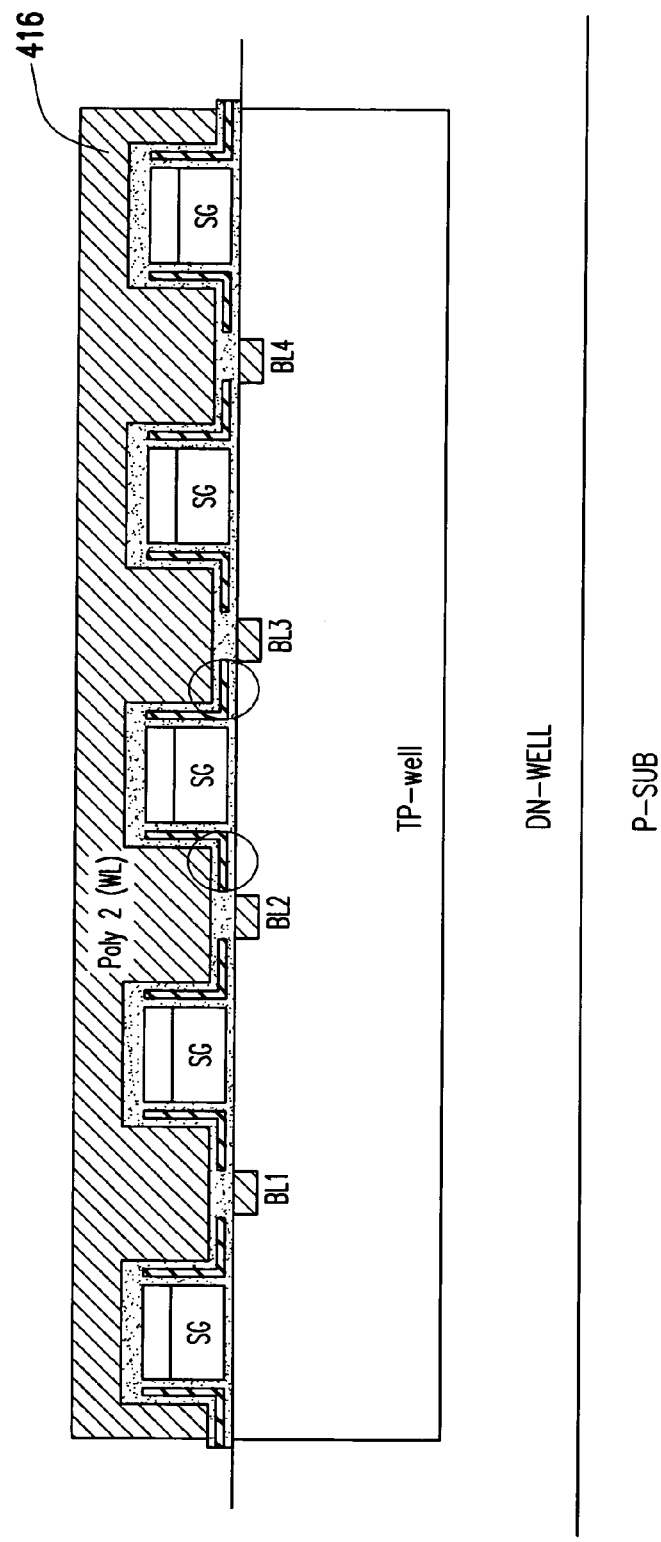
FIGS. 11 and 12A–12F are cross-sectional views, schematically illustrating an example of fabrication process to form the structure of non-volatile memory, according to an embodiments of the invention.
Figure 12A:
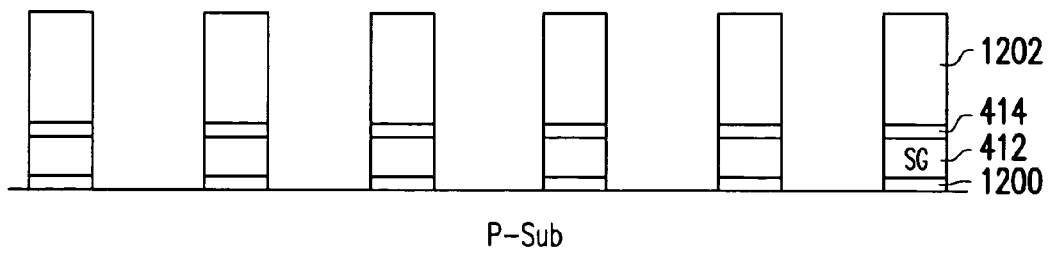
Figure 12B:
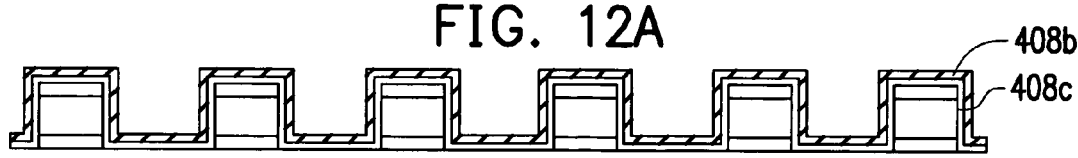
Figure 12C:
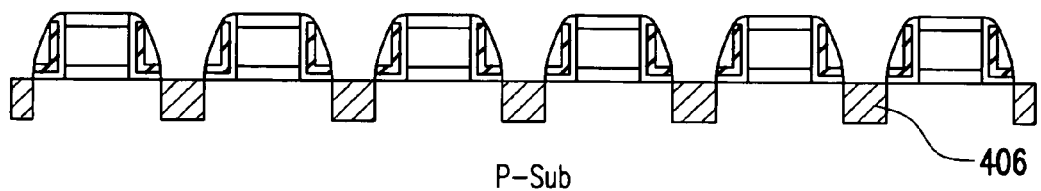
Figure 12D:
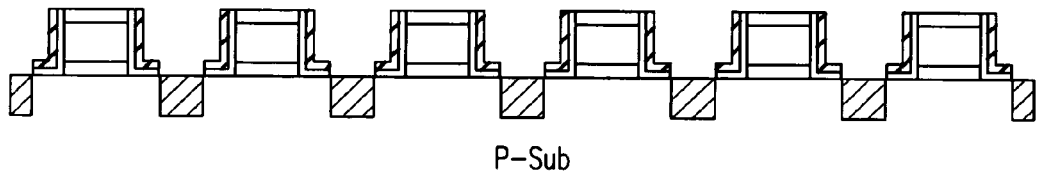
Figure 12E:
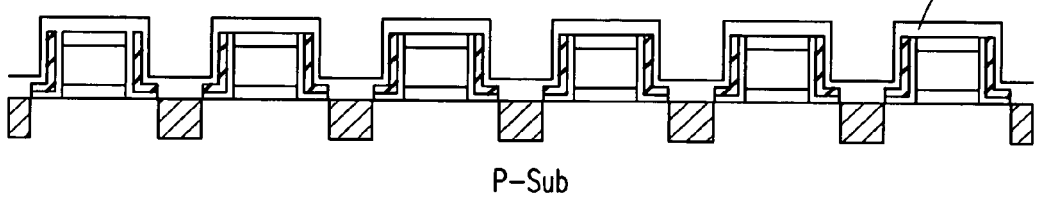
Figure 12F:
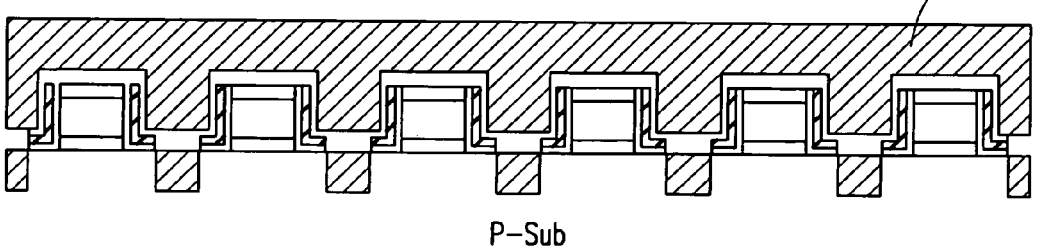

In FIG. 11, it is similar to FIG. 4. The word line 416 can be formed by polysilicon layer or usually called poly 2. In FIG. 11, the main charge storage region on the nitride layer is indicated by circle. In other words, from the structure point of view, the nitride layer can also be only the horizontal part without the sidewall part at the sidewall of the SG. However, FIG. 11 is only an example and can be formed by the steps in FIGS. 12A–12F. FIGS. 12A–12F are cross-sectional views, schematically illustrating an example of fabrication process to form the structure in FIG. 11, according to an embodiment of the invention. In FIG. 12A, a dielectric layer 1200, a conductive layer 412, and a second dielectric layer 414 are sequentially formed on the substrate, which is, for example, a P-substrate. Then, the patterning process with the photoresist layer 1202 is performed to form the selection gate lines, which in general includes the conductive layer 412 and the dielectric layer 414. The conductive layer 412 can be, for example, the polysilicon layer to serve the selection gate and the dielectric cap layer 414 can be, for example, silicon oxide or silicon nitride. Since the O/N/O structure is to be formed in this example, the oxide layer 408c and the nitride layer 408b are formed over the substrate, as shown in FIG. 12B. In FIG. 12C, a dielectric layer is deposited and an etching back process is performed, so as to form a spacer at the sidewall of the SG structure. The etching back process can expose the cap layer 414. Then, an implantation process is performed to form the doped region 406 in the substrate, in which an annealing process can be also included to diffuse the dopants in doped region 406. The doped region 406 is the buried bit line and also serves as the S/D region. In FIG. 12D, the spacer is removed. In FIG. 12E, a dielectric layer 408a and third dielectric layer is formed over the substrate. However, the discontinuous of the charge-trapping layer 408b has the better capability to localize the stored charges. In FIG. 12F, the word line 416 is formed over the substrate.

The present invention includes the features of the selection gates formed between the two buried bit lines. The selection gates are properly controlled to apply the operation voltage, so as to create an inversion region. The inversion region can also serve as the additional S/D region in operation of MOS transistor. Also and the SG structure with the sidewall charge storage film can further improve the charge localization. The storage charges can be well localized at the expected region without causing charge-drifting error to the adjacent bit.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A structure of non-volatile memory, comprising:
   a substrate;
   a plurality of bit lines formed in the substrate along a first direction, wherein each of the bit lines also serve as a source/drain (S/D) region;
   a first dielectric layer, disposed over the substrate;
   a plurality of selection gate (SG) lines formed over the first dielectric layer between the bit lines;
   a plurality of charge-storage structure layer, formed over the substrate between the bit lines and the SG lines;
   a second dielectric layer, formed over the SG lines;
   a third dielectric layer, formed over the bit lines; and
   a plurality of word lines, formed over the substrate along a second direction, which is crossing the first direction for the bit lines.

2. The structure of non-volatile memory of claim 1, wherein the charge-storage structure layer includes a charge-trapping dielectric layer.

3. The structure of non-volatile memory of claim 2, wherein the charge-trapping dielectric layer at the region above the bit lines is discontinuous or continuous.

4. The structure of non-volatile memory of claim 2, wherein the charge-trapping dielectric layer includes a horizontal part over the substrate and a vertical part over sidewall of the SG lines.

5. The structure of nonvolatile memory of claim 4, wherein the charge-trapping dielectric layer further comprises another horizontal part over the second dielectric layer.

6. The structure of non-volatile memory of claim 1, wherein the charge-storage structure layers includes a floating gate layer for charge storage.

7. The structure of non-volatile memory of claim 1, further comprising:
   a plurality of bank-select transistors respectively disposed between the S/D regions and the bit line voltages for selection and applying the bit line voltage.

8. The structure of non-volatile memory of claim 1, further comprising a source voltage supplying structure coupled to the SG lines, so that a desired voltage state is applied to the selected one of the memory cells to form an operation path.

9. A structure of a non-volatile memory unit with two-bit memory capacity, comprising:
   a substrate;
   two doped lines, located in the substrate;
   a selection gate structure line, disposed on the substrate between the two doped lines;
   a charged storage structure layer, located each side of the selection gate structure line between the doped lines and the selection gate line;
   a first dielectric layer, disposed over the selection gate structure line;
   a second dielectric layer, disposed over the doped lines; and
   a gate electrode layer, disposed crossing over the doped lines and the selection gate structure line.

10. The structure of claim 9, wherein the charged storage structure layer comprises a dielectric/charge-storage/dielectric structure layer or a floating gate structure layer.

11. The structure of claim 10, wherein the charged storage structure layer comprises an oxide/nitride/oxide structure layer.

* * * * *

UNITED STATES PATENT AND TRADEMARK OFFICE
CERTIFICATE OF CORRECTION

PATENT NO. : 6,987,298 B2
DATED : January 17, 2006
INVENTOR(S) : Chien-Hsing Lee et al.

It is certified that error appears in the above-identified patent and that said Letters Patent is hereby corrected as shown below:

<u>Title page,</u>
Item [73], Assignee, change "Solide State System Co., Ltd." to -- Solid State System Co., Ltd. --.

Signed and Sealed this

Second Day of May, 2006

JON W. DUDAS
*Director of the United States Patent and Trademark Office*